United States Patent
Jang et al.

(10) Patent No.: US 10,573,780 B2
(45) Date of Patent: Feb. 25, 2020

(54) ULTRAVIOLET LIGHT-EMITTING DEVICE

(71) Applicant: Seoul Viosys Co., Ltd., Ansan-si (KR)

(72) Inventors: Seong Kyu Jang, Ansan-si (KR); Hong Suk Cho, Ansan-si (KR); Kyu Ho Lee, Ansan-si (KR); Chi Hyun In, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/069,665

(22) PCT Filed: Jan. 11, 2017

(86) PCT No.: PCT/KR2017/000356
§ 371 (c)(1),
(2) Date: Aug. 2, 2018

(87) PCT Pub. No.: WO2017/122996
PCT Pub. Date: Jul. 20, 2017

(65) Prior Publication Data
US 2018/0366613 A1    Dec. 20, 2018

(30) Foreign Application Priority Data

Jan. 13, 2016  (KR) .................. 10-2016-0004351
Jan. 11, 2017  (KR) .................. 10-2016-0171829

(51) Int. Cl.
*H01L 33/08*      (2010.01)
*H01L 33/02*      (2010.01)
(Continued)

(52) U.S. Cl.
CPC .......... *H01L 33/02* (2013.01); *H01L 24/81* (2013.01); *H01L 33/38* (2013.01); *H01L 33/46* (2013.01);
(Continued)

(58) Field of Classification Search
CPC .......... H01L 33/20; H01L 33/38; H01L 33/62
See application file for complete search history.

(56) References Cited

U.S. PATENT DOCUMENTS 9,048,409 B2 * 6/2015 Seo ..................... H01L 27/153
2005/0277218 A1 * 12/2005 Nakajo ................. H01L 33/20
438/46
(Continued)

FOREIGN PATENT DOCUMENTS

JP    2011-258916    12/2011
KR    10-2012-0031473    4/2012
(Continued)

OTHER PUBLICATIONS

International Search Report dated Mar. 17, 2017, in International Application No. PCT/KR2017/000356 (with English Translation).
(Continued)

*Primary Examiner* — George R Fourson, III
(74) *Attorney, Agent, or Firm* — H.C. Park & Associates, PLC

(57) ABSTRACT

An ultraviolet light-emitting device including a substrate, a first conductive type semiconductor layer disposed on the substrate, a mesa disposed on the first conductive type semiconductor layer and including a second conductive type semiconductor layer and an active layer disposed between the semiconductor layers, a first contact electrode contacting the exposed first conductive type semiconductor layer around the mesa, a second contact electrode contacting the second conductive type semiconductor layer on the mesa, a passivation layer covering the first contact electrode, the mesa, and the second contact electrode and having openings disposed above the first and second contact electrodes, and first and second bump electrodes electrically connected to the first and second contact electrodes through the openings of the passivation layer, in which the mesa has depressions
(Continued)

in plan view, and the first and second bump electrodes cover the openings and a portion of the passivation layer.

21 Claims, 14 Drawing Sheets

(51) Int. Cl.
 *H01L 33/38* (2010.01)
 *H01L 33/48* (2010.01)
 *H01L 23/00* (2006.01)
 *H01L 33/46* (2010.01)

(52) U.S. Cl.
 CPC .... *H01L 33/48* (2013.01); *H01L 2924/12041* (2013.01)

(56) References Cited

U.S. PATENT DOCUMENTS

| | | | | |
|---|---|---|---|---|
| 2006/0231852 | A1* | 10/2006 | Kususe | H01L 24/06 257/99 |
| 2006/0261358 | A1* | 11/2006 | Hwang | H01L 33/38 257/91 |
| 2012/0161196 | A1* | 6/2012 | Lowenthal | H01L 25/048 257/100 |
| 2012/0241793 | A1* | 9/2012 | In | H01L 33/486 257/98 |
| 2013/0092962 | A1* | 4/2013 | Paek | H01L 33/62 257/88 |
| 2015/0091041 | A1* | 4/2015 | Yoon | H01L 27/15 257/99 |
| 2017/0098739 | A1* | 4/2017 | Gaevski | H01L 33/387 |

FOREIGN PATENT DOCUMENTS

| | | |
|---|---|---|
| KR | 10-2012-0107874 | 10/2012 |
| KR | 10-2013-0042154 | 4/2013 |
| KR | 10-2015-0082806 | 7/2015 |
| KR | 10-2015-0146161 | 12/2015 |

OTHER PUBLICATIONS

Extended European Search Report dated Aug. 9, 2019, issued in the European Application No. 17738625.7.

* cited by examiner

ULTRAVIOLET LIGHT-EMITTING DEVICE

CROSS REFERENCE TO RELATED APPLICATION

This application is the National Stage Entry of International Application No. PCT/KR2017/000356, filed Jan. 11, 2017, and claims priority from Korean Patent Application No. 10-2016-0004351, filed on Jan. 13, 2016, and Korean Patent Application No. 10-2016-0171829, filed on Dec. 15, 2016, each of which are incorporated herein by reference for all purposes as if fully set forth herein.

BACKGROUND

Field

Exemplary Embodiments of the present invention relate to an ultraviolet (UV) light emitting device, and more particularly, to a UV light emitting device with improved light extraction efficiency.

Discussion of the Background

In recent years, there has been an increasing interest in a flip-chip type light emitting device in order to improve luminous efficiency while solving problems relating to heat dissipation.

A flip-chip type light emitting device is generally known as having better heat dissipation efficiency than typical light emitting devices and provides substantially no light shielding so as to have luminous efficacy that is 50% or higher than that of typical light emitting devices. However, despite such advantages, the flip-chip type light emitting device some disadvantages.

For example, an n-type semiconductor layer used for UV light emitting devices has much lower electrical conductivity than metals. Thus, when electric current flows through the n-type semiconductor layer, an active layer, and a p-type semiconductor layer, current crowding may occur along a path having low electrical resistance. For instance, electrical current flow can be formed between the active layer and the p-type semiconductor layer along a path having low electrical resistance in the n-type semiconductor layer.

Such current crowding causes insufficient light emission over the entire region of the active layer, thereby deteriorating luminous efficiency and reliability. In order to overcome this problem, it is necessary to increase forward voltage and to develop additional technology for increasing luminous intensity.

SUMMARY

Exemplary embodiments of the present invention provide a light emitting device, particularly, a UV light emitting device, which can prevent current crowding inside semiconductor layers while improving the degree of current spreading therein.

The present invention is not limited thereto and other features and advantages of the present invention will become apparent from the following detailed description.

In accordance with an embodiment of the present invention, a UV light emitting device includes: a substrate; a first conductivity-type semiconductor layer disposed on the substrate; a mesa disposed on the first conductivity-type semiconductor layer and including a second conductivity-type semiconductor layer and an active layer interposed between the first conductivity-type semiconductor layer and the second conductivity-type semiconductor layer; a first contact electrode contacting the first conductivity-type semiconductor layer exposed around the mesa; a second contact electrode disposed on the mesa and contacting the second conductivity-type semiconductor layer; a passivation layer covering the first contact electrode, the mesa and the second contact electrode, and including openings disposed on the first contact electrode and the second contact electrode; and a first bump electrode and a second bump electrode electrically connected to the first contact electrode and the second contact electrode through the openings of the passivation layer, respectively, wherein the mesa has a plurality of indentations in plan view and each of the first bump electrode and the second bump electrode covers the openings of the passivation layer and a portion of the passivation layer.

The first contact electrode may contact the first conductivity-type semiconductor layer at least in the indentations of the mesa.

The UV light emitting device may further include a first pad electrode disposed on the first contact electrode; and a second pad electrode disposed on the second contact electrode, wherein the openings of the passivation layer expose the first pad electrode and the second pad electrode, and the first bump electrode and the second bump electrode may be connected to the first pad electrode and the second pad electrode through the openings, respectively.

The first pad electrode and the second pad electrode may include the same metallic material.

The UV light emitting device may further include a step pad layer interposed between the first contact electrode and the first pad electrode.

The UV light emitting device may further include an anti-step pattern disposed on the first pad electrode and the second pad electrode.

The openings of the passivation layer exposing the first contact electrode may be separated from the mesa and the openings of the passivation layer exposing the second contact electrode may be disposed within an upper region of the mesa.

The first contact electrode may surround the mesa.

The indentations may have an elongated shape in the same direction.

The substrate may be one of a silicon (Si) substrate, a zinc oxide (ZnO) substrate, a gallium nitride (GaN) substrate, a silicon carbide (SiC) substrate, an aluminum nitride (AlN) substrate, and a sapphire substrate.

The mesa may have a mirror symmetry structure.

The mesa may have a main branch and a plurality of sub-branches extending from the main branch.

A portion of the first bump electrode may be disposed on the mesa to overlap the mesa and the first bump electrode may be spaced apart from the mesa by the passivation layer.

The openings of the passivation layer disposed on the first contact electrode may be partially placed in the indentations.

The first bump electrode may be symmetrically disposed at opposite sides of the second bump electrode such that the second bump electrode is interposed therebetween. Furthermore, the first bump electrodes may be connected to each other.

The second bump electrode may have an arc-shaped end portion.

The second bump electrode may include a plurality of unit electrodes connected to each other by a connecting portion.

The UV light emitting device may emit deep UV light having a wavelength of 360 nm or less.

In accordance with an embodiment of the present invention, a UV light emitting device includes: a substrate; a first conductivity-type semiconductor layer disposed on the substrate; a mesa disposed on the first conductivity-type semiconductor layer, and including a second conductivity-type semiconductor layer and an active layer interposed between the first conductivity-type semiconductor layer and the second conductivity-type semiconductor layer; a first contact electrode contacting the first conductivity-type semiconductor layer exposed around the mesa; a second contact electrode disposed on the mesa and contacting the second conductivity-type semiconductor layer; a passivation layer covering the first contact electrode, the mesa and the second contact electrode, and including openings disposed on the first contact electrode and the second contact electrode; and a first bump electrode and a second bump electrode electrically connected to the first contact electrode and the second contact electrode through the openings of the passivation layer, respectively, wherein the mesa has a plurality of indentations in plan view and some of the openings of the passivation layer are disposed outside the mesa and the indentations.

The passivation layer may further include openings disposed inside the indentations, and the openings disposed inside the indentations may be connected to each other through the openings disposed outside the indentations.

The passivation layer may further include openings disposed inside the indentations, and the openings disposed inside the indentations may be separated from each other.

According to exemplary embodiments of the present invention, the UV light emitting device includes a plurality of second bump electrodes disposed near a first bump electrode such that a separation distance between the first bump electrode and end portions of the second bump electrodes gradually increases or decreases, thereby allowing charges having a constant current spreading length to spread over a broader area. In addition, the first contact electrode is disposed to surround a mesa M, thereby enabling more uniform control of a current path from the first contact electrode to the second conductivity-type semiconductor layer through the first conductivity-type semiconductor layer. With this structure, the UV light emitting device has reduced resistance in the first conductivity-type semiconductor layer, thereby decreasing forward voltage thereof.

Furthermore, the mesa is formed with indentations to reduce a current path through the first conductivity-type semiconductor layer, thereby preventing current crowding. Furthermore, in the UV light emitting device, the first bump electrode and the second bump electrode are formed to partially cover the passivation layer, thereby increasing the sizes of the first bump electrode and the second bump electrode.

It should be understood that the present invention is not limited to the aforementioned effects and includes all advantageous effects deducible from the detailed description of the present invention or the appended claims.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION

Figure 1:
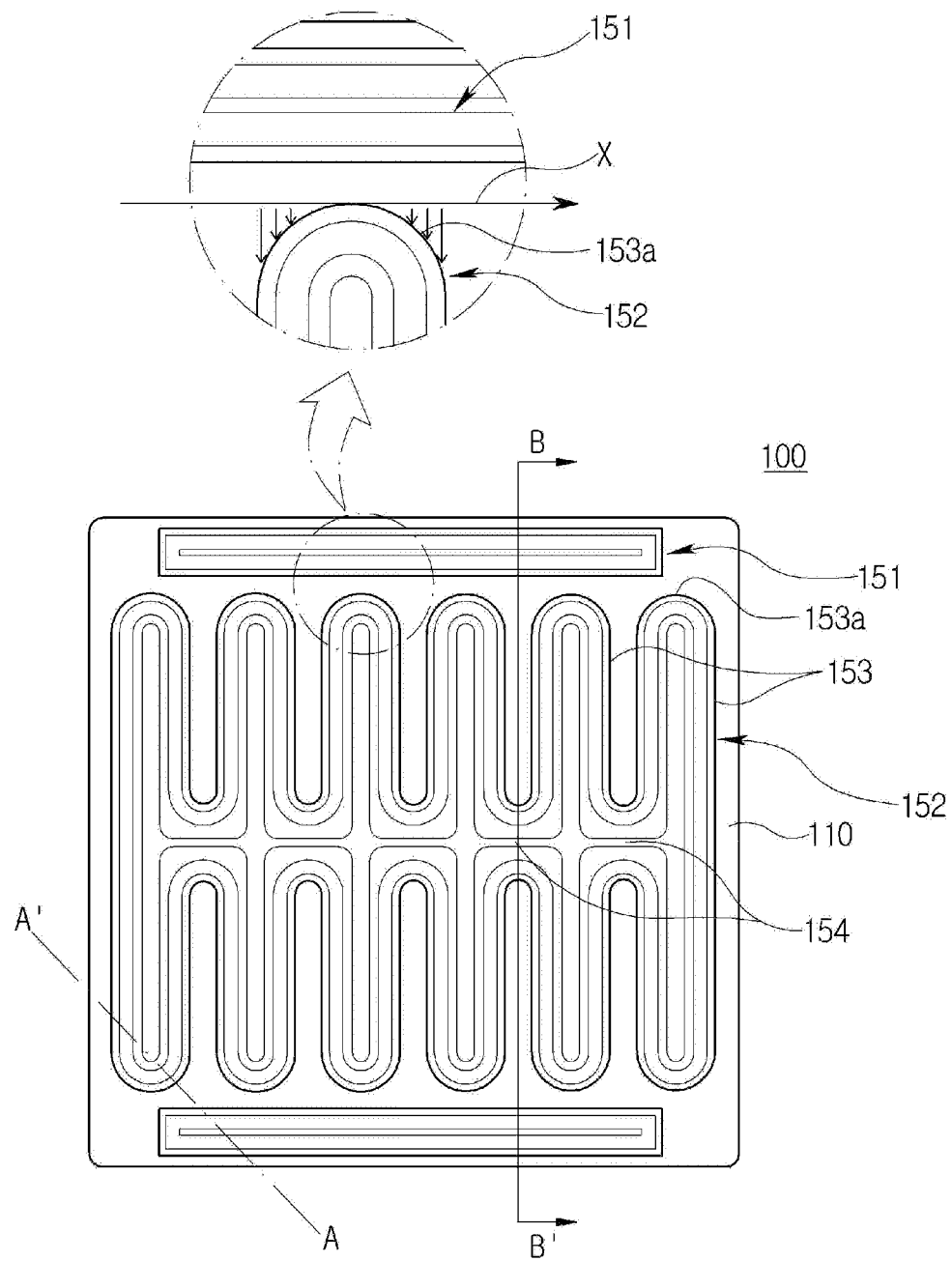
FIG. 1 is a plan view of a light emitting device according to one exemplary embodiment of the present invention.

Hereinafter, exemplary embodiments of the present invention will be described in detail with reference to the accompanying drawings. However, the present invention is not limited to the embodiments disclosed herein and can also be implemented in different forms. In addition, portions irrelevant to the present invention will be omitted for clarity in the accompanying drawings and like components will be denoted by the same or like reference numerals throughout the specification.

When an element or layer is referred to as being "connected to" or "coupled to" another element or layer throughout the specification, it can be directly connected or coupled to the other element or layer, or intervening elements or layers can be present. In addition, the terms "comprises," "comprising," "including," and "having" are inclusive and therefore specify the presence of stated features, integers, steps, operations, elements, and/or components, but do not preclude the presence or addition of one or more other features, integers, steps, operations, elements, components, and/or groups thereof.

Hereinafter, exemplary embodiments of the present invention will be described in detail with reference to the accompanying drawings.

Figure 2:
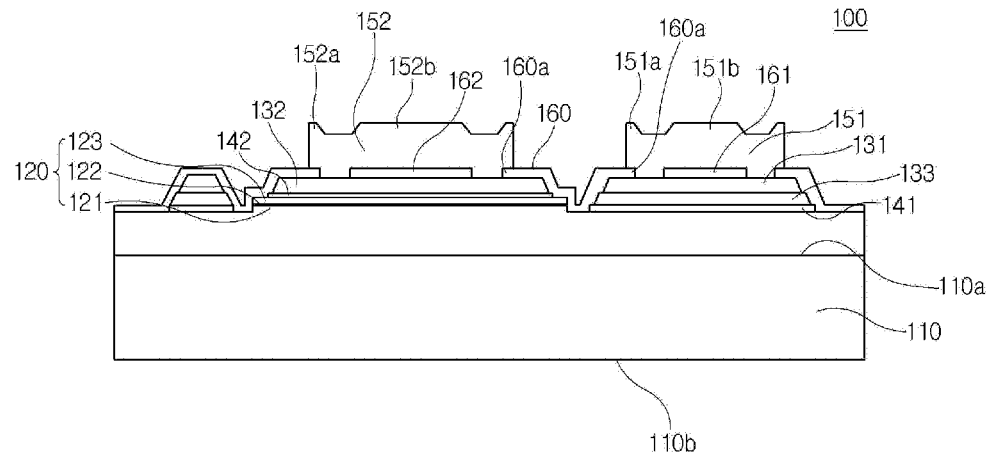
FIG. 2 and FIG. 3 are cross-sectional views taken along line A-A' and line B-B' of FIG. 1.
Figure 3:
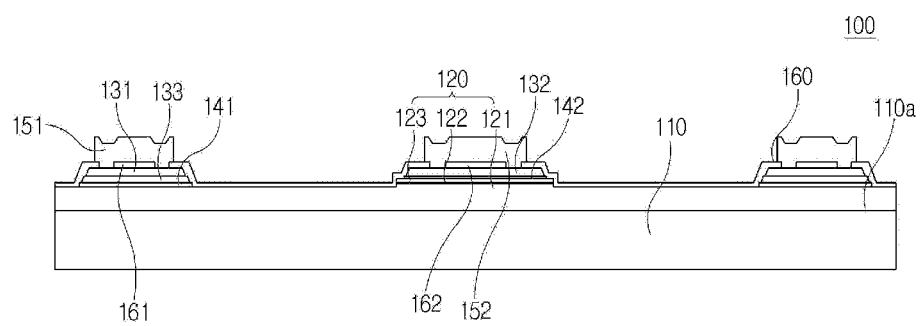

FIG. 1 is a plan view of a light emitting device according to one exemplary embodiment of the present invention, and FIG. 2 and FIG. 3 are cross-sectional views taken along line A-A' and line B-B' of FIG. 1.

Referring to FIG. 1, FIG. 2, and FIG. 3, a light emitting device 100 according to one exemplary embodiment of the present invention may include a first substrate 110.

The first substrate 110 is provided for growth of a single crystal semiconductor thereon and may have a first plane 110a and a second plane 110b opposing the first plane 110a. The first plane 110a is an upper surface of the first substrate 110 on which the single crystal semiconductor will be grown, and the second plane 110b is a lower surface thereof.

The first substrate 110 may include a zinc oxide (ZnO) substrate, a gallium nitride (GaN) substrate, a silicon carbide (SiC) substrate, an aluminum nitride (AlN), and a sapphire substrate. For example, the first substrate 110 may be formed of a transparent material including sapphire, which has a high degree of crystal orientation and allows precise polishing to provide no flaw or stain. The first plane 110a and the second plane 110b of the first substrate 110 may have a rectangular shape.

The light emitting device 100 according to the illustrated exemplary embodiment may include a first bump electrode 151 and a second bump electrode 152 formed on the first plane 110a of the first substrate 110. The first bump electrode 151 and the second bump electrode 152 may have opposite polarities. For example, the first bump electrode 151 may be an N-type bump electrode and the second bump electrode 152 may be a P-type bump electrode.

The first bump electrode 151 may have an axial direction of a first direction on the first plane 110a of the first substrate 110, and the second bump electrode 152 may have an axial direction of a second direction thereon. The first direction may be a direction parallel to one side of the first plane 110a of the first substrate 110, and the second direction may be a direction perpendicular to the first direction. For example, the first direction may be an X-axis direction and the second direction may be a Y-axis direction.

The second bump electrode 152 may include a plurality of unit electrodes 153 to form a plurality of current paths, thereby improving current spreading. The unit electrodes 153 may have a constant length and a constant width and may be arranged parallel to each other. Each of the unit electrodes 153 may be connected to adjacent unit electrodes via a connecting portion 154 disposed at the center of the first plane. Accordingly, the unit electrodes 153 may be symmetrically arranged with reference to the connecting portion 154 at the center of the first plane. Since the connecting portion 154 is formed to be orthogonal to each of the unit electrodes 153, the first bump electrode 151 and the connecting portion 154 may be disposed to be parallel to each other.

Each of the unit electrodes 153 has an end portion 153a near the first bump electrode 151. Particularly, the unit electrodes 153 may be formed such that a separation distance between the end portion 153a of each of the unit electrodes 153 and an imaginary axis X parallel to the axial direction of the first bump electrode 151 gradually increases or decreases. For example, the end portion 153a of each of the unit electrodes 153 has an arc shape protruding toward the first bump electrode 151, thereby minimizing current crowding between the first bump electrode 151 and the second bump electrode 152.

A pair of first bump electrodes 151 may be disposed at opposite sides of the second bump electrode 152 to be symmetrical to each other, such that electric current can be injected through the pair of first bump electrodes 151, thereby further improving current spreading efficiency. That is, the first bump electrode 151 may be further formed to be parallel to the other side of the first plane 110a of the first substrate 110. The second bump electrode 152 may be interposed between the pair of first bump electrodes 151 and both end portions 153a of the second bump electrode 152 may be disposed near the first bump electrodes 151, respectively.

Referring to FIG. 2 and FIG. 3, the light emitting device 100 may be a UV light emitting device capable of emitting light in the UV wavelength range. For example, a UV light emitting device according to one exemplary embodiment may emit deep UV light having a wavelength of 360 nm or less.

The light emitting device 100 may include the first substrate 110 and a light emitting diode 120 disposed on the first substrate 110, and having a semiconductor stack structure.

A buffer layer (not shown) may be further formed on the first plane 110a of the first substrate 110 to relieve lattice mismatch between the first substrate 110 and a first conductivity-type semiconductor layer 121. The buffer layer may be composed of a single layer or multiple layers. The buffer layer composed of multiple layers may include a low temperature buffer layer and a high temperature buffer layer.

The light emitting diode 120 (e.g., semiconductor stack) is a light emitting structure for converting energy into light through recombination of electrons and holes, and may be formed on the first substrate 110, which is subjected to surface treatment through a wet or dry process using a semiconductor thin film growth apparatus.

The light emitting diode 120 may include the first conductivity-type semiconductor layer 121, an active layer 122, and a second conductivity-type semiconductor layer 123, which are sequentially stacked on the first plane 110a of the first substrate 110.

The first conductivity-type semiconductor layer 121 may be disposed on the first plane 110a of the first substrate 110 and may be partially exposed, as shown in FIG. 2. Specifically, the partially exposed region of the first conductivity-type semiconductor layer 121 may be formed by mesa etching part of the active layer 122 and the second conductivity-type semiconductor layer 123. During mesa etching, the first conductivity-type semiconductor layer 121 may also be partially removed by etching. As a result, a mesa including the active layer 122 and the second conductivity-type semiconductor layer 123 is formed on the first conductivity-type semiconductor layer 121. As shown in FIG. 2 and FIG. 3, the second bump electrode 152 is disposed on the mesa and the first bump electrode 151 is separated from the mesa. The mesa has a shape similar to that of the second bump electrode 152 and has indentations each being disposed between the unit electrodes 153. For example, the mesa may include a main branch disposed under the connecting portion 154 and sub-branches corresponding to portions of the unit electrodes 153 extending from opposite sides of the connecting portion 154.

The first conductivity-type semiconductor layer 121 may be formed of an $In_xAl_yGa_{1-x-y}N$ ($0 \le x \le 1$, $0 \le y \le 1$, $0 \le x+y \le 1$) based Group III-V compound semiconductor doped with first conductivity-type dopants, for example, N-type dopants, and may be composed of a single layer or multiple layers. Examples of the N-type dopants may include Si, Ge, Sn, and the like. In particular, the first conductivity-type semiconductor layer 121 has a relatively high bandgap to allow UV light generated from the active layer 122 to pass therethrough.

The active layer 122 may be disposed on the first conductivity-type semiconductor layer 121 and generates light through recombination of electrons and holes supplied from the first conductivity-type semiconductor layer 121 and the second conductivity-type semiconductor layer 123. According to one exemplary embodiment, the active layer 122 may have a multi-quantum well structure in order to improve efficiency in recombination of electrons and holes. Compositional elements and ratio of the active layer 122 may be determined to emit light having a desired wavelength, for example, UV light having a peak wavelength in the range of 200 nm to 360 nm.

The second conductivity-type semiconductor layer 123 may be disposed on the active layer 122 and may be formed of an $In_xAl_yGa_{1-x-y}N$ (0≤x≤1, 0≤y≤1, 0≤x+y≤1) based compound semiconductor doped with second conductivity-type dopants, for example, P-type dopants. The second conductivity-type semiconductor layer 123 may be composed of a single layer or multiple layers.

A first pad electrode 131 and a second pad electrode 132 may be formed on the first conductivity-type semiconductor layer 121 and the second conductivity-type semiconductor layer 123, respectively. The first pad electrode 131 and the second pad electrode 132 may include Ni, Cr, Ti, Al, Ag, or Au. The first pad electrode 131 may be electrically connected to the exposed portion of the first conductivity-type semiconductor layer 121, and the second pad electrode 132 may be electrically connected to the exposed portion of the second conductivity-type semiconductor layer 123.

The light emitting device 100 may further include a step pad layer 133 between the first conductivity-type semiconductor layer 121 and the first pad electrode 131. The step pad layer 133 compensates for a step difference, such that the elevation of the first pad electrode 131 corresponds to the elevation of the second pad electrode 132. That is, due to mesa etching of the first conductivity-type semiconductor layer 121, the first pad electrode 131 may be placed at a lower location than the second pad electrode 132 without the step pad layer 133. However, the elevation of the first pad electrode 131 may become offset by the step pad layer 133 under the first pad electrode 131. The step pad layer 133 may include, for example, Ti and Au.

In addition, the light emitting device 100 may further include the first contact electrode 141 and a second contact electrode 142 between the first conductivity-type semiconductor layer 121 and the step pad layer 133, and between the second conductivity-type semiconductor layer 123 and the second pad electrode 132 in order to improve ohmic contact characteristics. The first contact electrode 141 may include, for example, Cr, Ti, Al and Au, and the second contact electrode 142 may include, for example, Ni and Au.

Here, the first contact electrode 141 is an electrode for forming ohmic contact characteristics with the first conductivity-type semiconductor layer 121, and is disposed in the exposed region of the first conductivity-type semiconductor layer 121 excluding a mesa region in order to improve current spreading of the UV light emitting device. The first contact electrode 141 surrounds the mesa and may also be placed inside the indentations of the mesa. The first contact electrode 141 may include a reflective material.

The reflective material serves to reflect UV light, which has been reflected from the first substrate 110 toward the first contact electrode 141, back toward the first substrate 110, thereby improving light extraction efficiency.

The reflective material may be formed of a metallic material having good conductivity. The reflective material may include, for example, Ag, Ni, Al, Rh, Pd, Ir, Ru, Mg, Zn, Pt, Au, and Hf. In particular, the reflective material may include aluminum (Al) having high reflectance in the UV wavelength band, and may be deposited not only in a planar structure, but also in a matrix of islands, in a plurality of lines, or in a mesh structure.

In one exemplary embodiment, the light emitting device 100 may further include a passivation layer 160 that serves to protect the light emitting diode 120 from external environments.

The passivation layer 160 may be formed of silicon oxide or an insulation material including silicon oxide. As shown in FIG. 2 and FIG. 3, the passivation layer 160 covers the first pad electrode 131, the second pad electrode 132, and the mesa. Here, the passivation layer 160 may be provided in the form of partially exposed regions on the surfaces of the first pad electrode 131 and the second pad electrode 132, such that the first bump electrode 151 is electrically connected to the second bump electrode 152 therethrough. That is, the passivation layer 160 has openings that expose the surfaces of the first pad electrode 131 and the second pad electrode 132. The passivation layer 160 may be formed of an insulator including an oxide or a nitride, particularly, silicon oxide.

The light emitting device 100 may be mounted on the second substrate 200 (see FIG. 8 and FIG. 9) in a flip-chip form. In this case, the light emitting device 100 may include the first bump electrode 151 and the second bump electrode 152 so as to be electrically connected to the second substrate 200.

The first bump electrode 151 may be disposed on the first pad electrode 131 and the second bump electrode 152 may be disposed on the second pad electrode 132. The first bump electrode 151 and the second bump electrode 152 may include, for example, Ti, Au, and Cr.

The second substrate 200 includes a first electrode portion 210 and a second electrode portion 220 on one surface thereof such that the first and second bump electrodes 151, 152 of the light emitting device 100 can be electrically and physically connected to the first and second electrode portions 210, 220, respectively.

Here, the bump electrodes 151, 152 may be formed to cover the surfaces of the pad electrodes 131, 132 and some regions of the surface of the passivation layer 160. That is, the bump electrodes 151, 152 cover the openings of the passivation layer 160 and may be partially disposed on the passivation layer 160 to overlap the passivation layer 160. For bonding reliability, a portion of the passivation layer 160 is interposed between the pad electrodes 131, 132 and the bump electrodes 151, 152, and the bump electrodes 151, 152 are formed to cover the exposed portions of the pad electrodes 131, 132 and some regions on the surface of the passivation layer 160.

On the other hand, anti-step patterns 161, 162 may be interposed between the pad electrodes 131, 132 and the bump electrodes 151, 152. For example, the anti-step patterns 161, 162 may be placed in the openings of the passivation layer 160.

FIG. 4 to FIG. 9 are cross-sectional views illustrating a method of manufacturing the light emitting device according to an exemplary embodiment of the present invention. Here, FIG. 4 to FIG. 9 are taken along line B-B' of FIG. 1.

Figure 4:
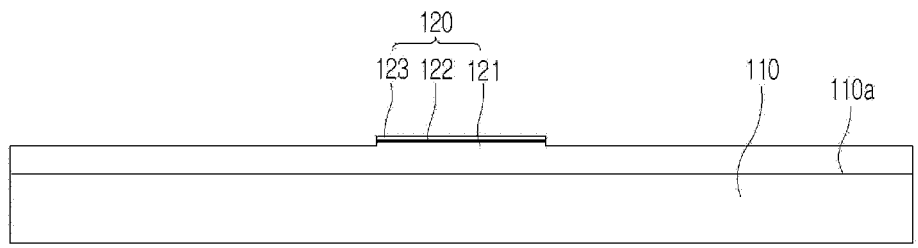
FIG. 4, FIG. 5, FIG. 6, FIG. 7, FIG. 8, and FIG. 9 are cross-sectional views illustrating a method of manufacturing the light emitting device according to an exemplary embodiment of the present invention, all of which are taken along line B-B' of FIG. 1.

Referring to FIG. 4, a first conductivity-type semiconductor layer 121, an active layer 122, and a second conductivity-type semiconductor layer 123 are formed on a first substrate 110.

Here, the first conductivity-type semiconductor layer 121, the active layer 122, and the second conductivity-type semiconductor layer 123 may be formed by forming respective semiconductor layers using a semiconductor layer formation method well-known in the art, for example, metal organic chemical vapor deposition (MOCVD), molecular beam deposition, epitaxial deposition, or others, followed by partially etching the second conductivity-type semiconductor layer 123 and the active layer 122 to expose some regions of the surface of the first conductivity-type semiconductor layer 121. As a result, a mesa including the active layer 122 and the second conductivity-type semiconductor layer 123 is formed.

Figure 5:
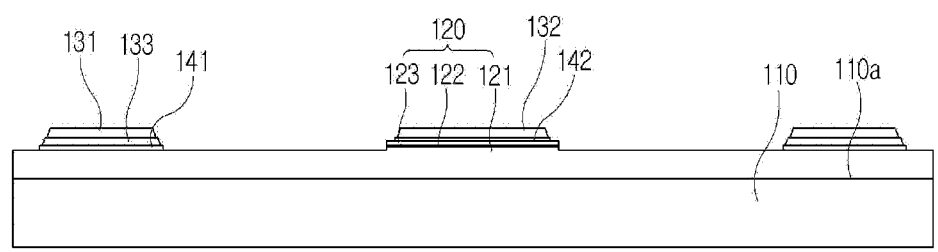

Referring to FIG. 5, a first pad electrode 131 is formed on the first conductivity-type semiconductor layer 121, and a second pad electrode 132 is formed on the second conductivity-type semiconductor layer 123.

The pad electrodes 131, 132 may be formed of Ti/Au. Contact electrodes 141, 142 may be formed before formation of the pad electrodes 131, 132. The contact electrode 141 is formed on the first conductivity-type semiconductor layer 121 and the contact electrode 142 is formed on the second conductivity-type semiconductor layer 123. For example, the contact electrode 141 may be formed of Ti/Al layers and the contact electrode 142 may be formed of Ni/Au layers.

Furthermore, a step pad layer 133 may be formed on the contact electrode 141. The step pad layer 133 compensates for a step difference due to the mesa to allow an upper surface of the first pad electrode 131 to be substantially flush with an upper surface of the second pad electrode 132.

Figure 6:
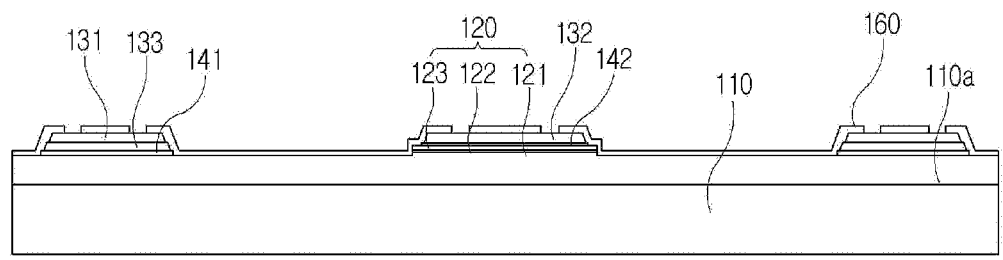

Referring to FIG. 6, an insulation layer is formed on the surface of the first substrate 110, on which the first conductivity-type semiconductor layer 121, the active layer 122, and the second conductivity-type semiconductor layer 123 are formed, and is partially removed by etching to open some regions on the surfaces of the pad electrodes 131, 132 to form the passivation layer 160.

That is, the passivation layer 160 is formed by forming the insulation layer over the entire surface of the first substrate 110, followed by exposing some regions of the pad electrodes 131, 132. As a result, the passivation layer 160 serves to protect the first and second conductivity-type semiconductor layers 121, 123 and the active layer 122 by covering the side surfaces of the second conductivity-type semiconductor layer 123 and the active layer 122 exposed by etching, and the surfaces of the first conductivity-type semiconductor layer 121 and the second conductivity-type semiconductor layer 123 exposed after formation of the pad electrodes 131, 132.

By this process, it is possible to form the light emitting device 100 including the semiconductor layers 121,122,123, the pad electrodes 131, 132 and the passivation layer 160 on the first substrate 110.

Figure 7:
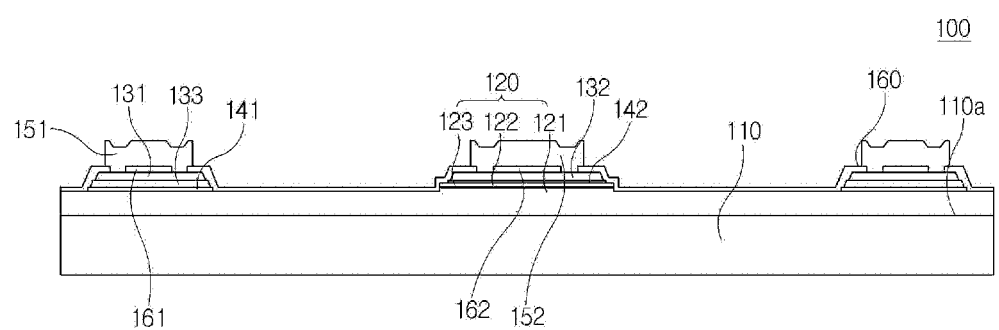

Referring to FIG. 7, a first bump electrode 151 and a second bump electrode 152 are formed on the first and second pad electrodes 131, 132 of the light emitting device 100, respectively.

The bump electrodes 151, 152 may be formed to cover the surfaces of the pad electrodes 131, 132 and some regions of the surface of the passivation layer 160. That is, for bonding reliability, a portion 150a of the passivation layer 160 is interposed between the pad electrodes 131, 132 and the bump electrodes 151, 152, and the bump electrodes 151, 152 are formed to cover the exposed portions of the pad electrodes 131, 132 and some regions of the surface of the passivation layer 160. Accordingly, protrusions 151a, 152a may protrude upwards from upper outer peripheries of the bump electrodes 151, 152, which cover some regions of the surface of the passivation layer 160. Due to formation of the protrusions 151a, 152a, the bump electrodes 151, 152 are generally formed to have stepped upper surfaces, thereby making it difficult to achieve stable bonding between the bump electrodes 151, 152 and the electrode portions 210, 220 upon mounting of the light emitting device 100 on the second substrate 200.

Accordingly, a first anti-step pattern 161 and a second anti-step pattern 162 may further be formed on the first pad electrode 131 and the second pad electrode 132, respectively. Due to formation of the first and second anti-step patterns 161, 162, anti-step portions 151b, 152b are formed in central regions of upper surfaces of the bump electrodes 151, 152 corresponding to the height of the protrusions 151a, 152a formed at the outer peripheries of the bump electrodes 151, 152, whereby the overall upper surfaces of the bump electrodes 151, 152 can have a considerably flat shape instead of having stepped portions.

The first and second anti-step patterns 161, 162 may be silicon oxide ($SiO_2$) patterns formed of the same material as the passivation layer 160. That is, the first and second anti-step patterns 161, 162 may be formed by etching the passivation layer 160 such that a portion of the passivation layer 160 remains on the pad during etching for exposure of the pad after formation of the passivation layer 160.

Figure 8:
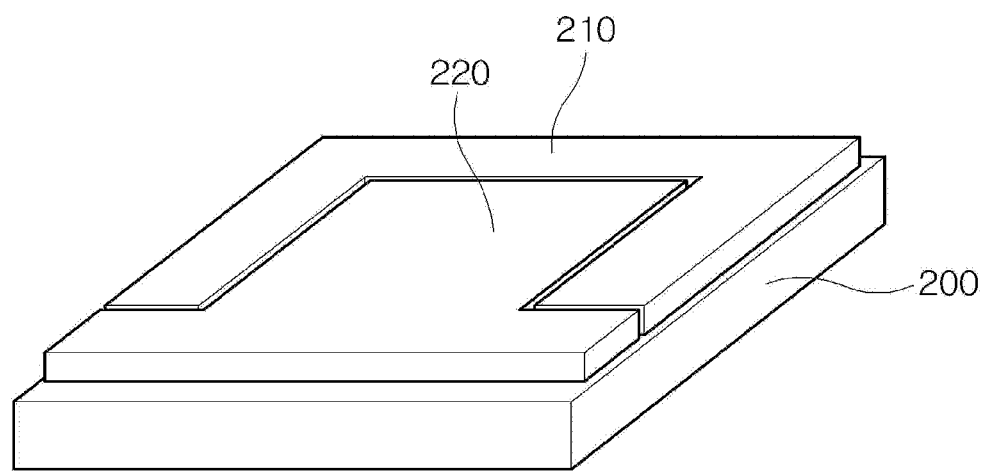
Figure 9:
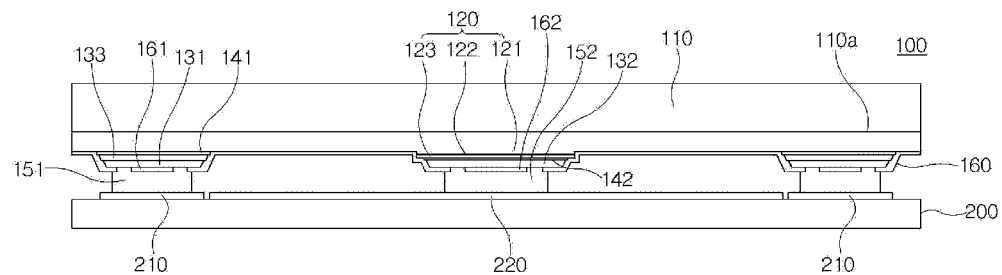

Referring to FIG. 8 and FIG. 9, the light emitting device 100 according to an exemplary embodiment may be mounted on the second substrate 200 in the form of a flip-chip bonded structure by a thermo-compression (T/C) method. The second substrate 200 may be a submount on which the light emitting diode 120 will be mounted.

The second substrate 200 may include a first electrode portion 210 and a second electrode portion 220 on one surface thereof, such that the first bump electrode 151 and the second bump electrode 152 of the light emitting device 100 can be connected to the first electrode portion 210 and the second electrode portion 220, respectively. For example, the first electrode may be an N-electrode and the second electrode may be a P-electrode.

Here, in order to compensate for a height difference between the bump electrodes 151, 152, the first electrode portion 210 and the second electrode portion 220 may have different heights. For example, the first electrode portion 210 has a greater thickness than the second electrode portion 220 to compensate for a step caused by the height difference between the bump electrodes 151, 152.

The first and second electrode portions 210, 220 may include gold or a gold-containing compound (for example, AuSn) to secure ease of flip bonding to the bump electrodes 151, 152, electrical conductivity, and thermal conductivity.

In order to mount the light emitting device 100 on the second substrate 200, the light emitting device 100 and the second substrate 200 are arranged so as to correspond to each other with reference to the bump electrodes 151, 152 and the first and second electrode portions 210, 220, followed by heating the bump electrodes 151, 152 to a preset temperature.

While a preset pressure is applied to the first substrate 110 or the second substrate 200, the temperature of the bump electrodes 151, 152 is gradually increased. After the increased temperature of the bump electrodes 151, 152 is maintained for a preset period of time, the pressure is released and the bump electrodes 151, 152 are cooled to room temperature such that the bump electrodes 151, 152 can be flip-chip bonded to the first and second electrode portions 210, 220, thereby completing mounting of the light emitting device 100 including the bump electrodes 151, 152 to the second substrate 200 that includes the first and second electrode portions 210, 220.

Here, protrusions 151a, 152a and anti-step portions 151b, 152b are formed at the same height on bump electrodes 151, 152 so as to minimize a step thereon, thereby improving bonding reliability with respect to the first and second electrode portions 210, 220.

Figure 10:
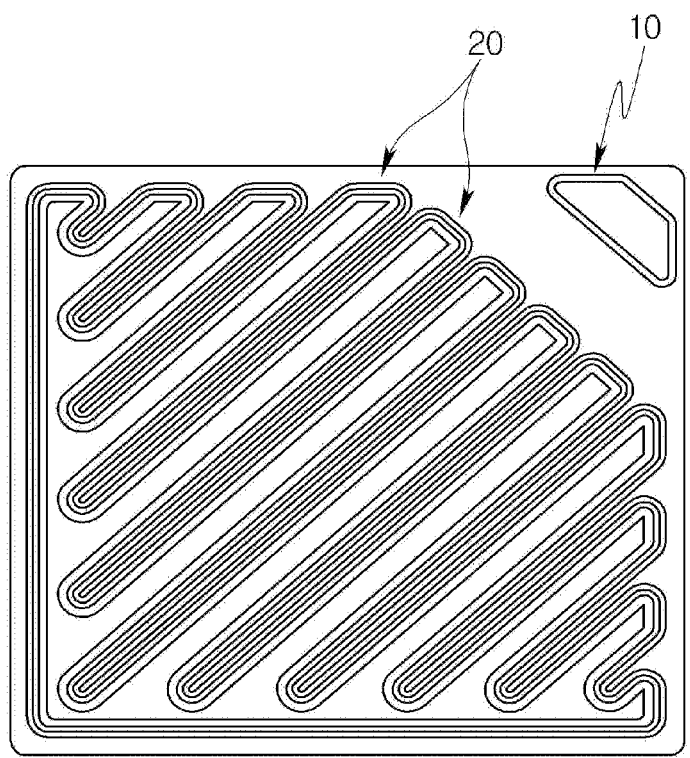
FIG. 10, FIG. 11, and FIG. 12 are plan views of UV light emitting devices according to exemplary embodiments of the present invention.
Figure 11:
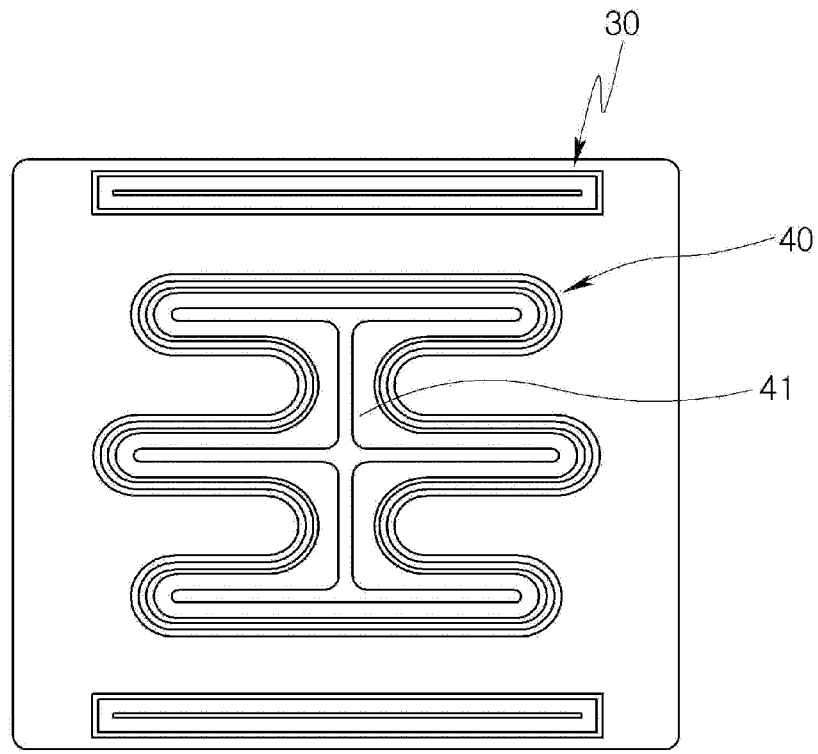
Figure 12:
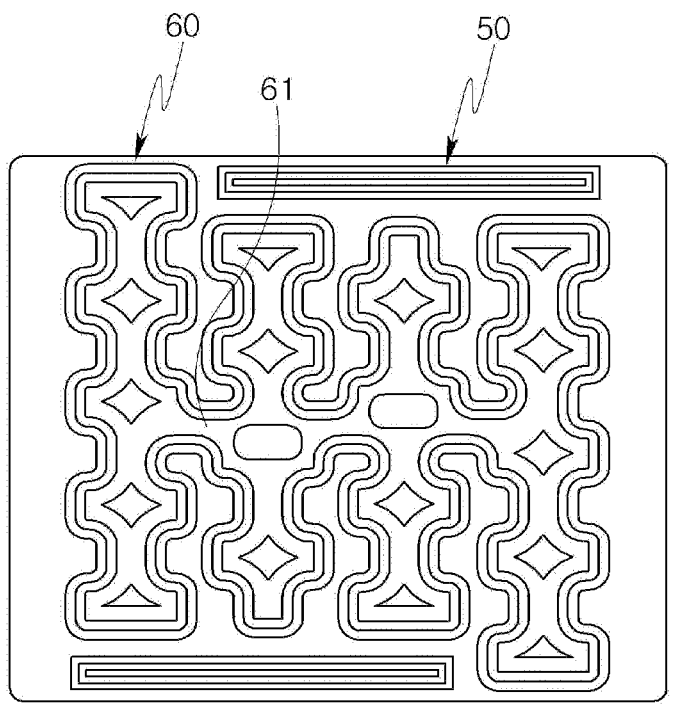

FIG. 10 to FIG. 12 are plan views of UV light emitting devices according to exemplary embodiments of the present invention.

In a UV light emitting device shown in FIG. 10, a first bump electrode 10 is disposed at one corner of a substrate having a substantially rectangular shape, such that an axial direction of the first bump electrode 10 is placed in a diagonal direction, and a plurality of second bump electrodes 20 is formed to be orthogonal to the axial direction of the first bump electrode 10. The second bump electrodes 20 may be disposed on a mesa having indentations and connected to each other. When the first bump electrode 10 is disposed at one corner of the substrate and the second bump electrodes 20 are disposed to occupy most of an upper surface of the substrate, the light emitting device has an increased light emitting area. However, in the light emitting device according to this exemplary embodiment, the first bump electrode 10 is biased to one corner of the substrate, thereby causing reduction in luminous intensity due to decrease in current density.

In a UV light emitting device shown in FIG. 11, a pair of first bump electrodes 30 is disposed at opposite sides of a substrate having a substantially rectangular shape and a plurality of second bump electrodes 40 is formed between the first bump electrodes 30 to be parallel to the first bump electrodes 30. The second bump electrodes 40 may be connected to each other by a connecting portion 41. Here, the first bump electrodes 30 and the second bump electrodes 40 are disposed to be parallel to one another, thereby increasing forward voltage due to current crowding.

In a UV light emitting device shown in FIG. 12, a pair of first bump electrodes 50 is disposed at opposite sides of a substrate and a plurality of second bump electrodes 60 having an uneven width is disposed between the first bump electrodes 50 so as to be orthogonal to the axial direction of the first bump electrode 50. The second bump electrodes 60 may be connected to each other by a connecting portion 61. The first bump electrodes 50 and the second bump electrodes 60 are formed such that the axial direction of each of the first bump electrodes 50 is perpendicular to the axial direction of each of the second bump electrodes 60, and the first bump electrodes 50 have a different width than the second bump electrodes 60 adjacent thereto. In addition, at least one of the second bump electrodes 60 may extend to one corner of the substrate. Here, current spreading can be deteriorated near the extended portion of the second bump electrode.

Figure 13:
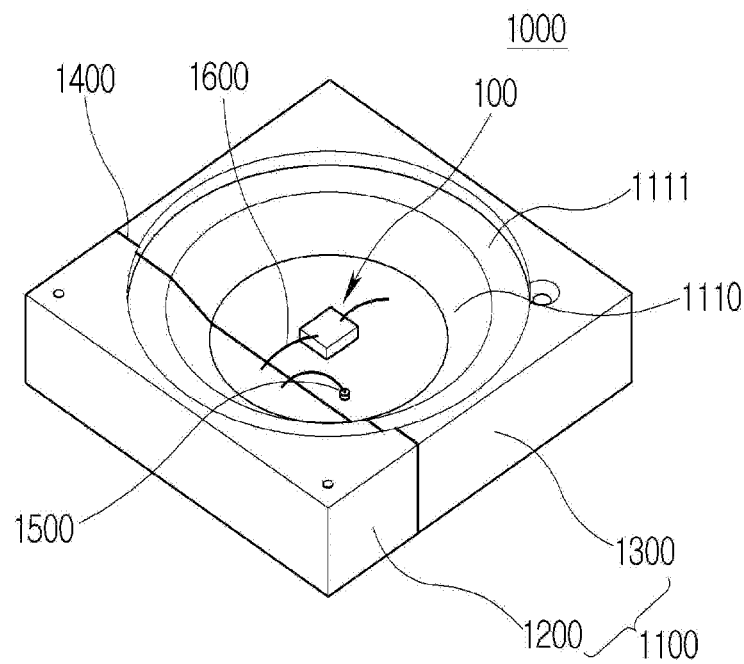
FIG. 13 is a perspective view of a light emitting device package according to one exemplary embodiment of the present invention.

FIG. 13 is a perspective view of a light emitting device package according to one exemplary embodiment of the present invention.

Referring to FIG. 13, a light emitting device package 1000 according to an exemplary embodiment may include a package body 1100 and a light emitting device 100 mounted on the package body 1100.

The package body 1100 has a cavity 1110 depressed on one surface thereof such that an inclined surface 1111 can be formed around the light emitting device 100. The inclined surface 1111 can improve light extraction efficiency of the light emitting device package.

The package body 1100 is divided into a first electrode portion 1200 and a second electrode portion 1300 by an insulating portion 1400 to be electrically isolated from each other.

The package body 1100 may include a silicone material, a synthetic resin material, or a metallic material. For example, in order to improve heat dissipation upon discharge of UV light from the light emitting device 100, the package body 1100 may be formed of an aluminum material. Accordingly, the first electrode portion 1200 and the second electrode portion 1300 can improve luminous efficiency by reflecting light emitted from the light emitting device 100 and also serve to discharge heat generated from the light emitting device 100.

The light emitting device 100 may be electrically connected to the first electrode portion 1200 and the second electrode portion 1300 by a connection member 1600, such as a metal wire, to receive electric power therethrough.

In a state of being mounted on the second substrate, the light emitting device 100 may be mounted on the cavity 1110 of the package body 1100 and may be electrically connected to the first electrode portion 1200 and the second electrode portion 1300 by a metal wire. Reference numeral 1500 indicates a Zener diode, which is a constant voltage diode.

Figure 14:
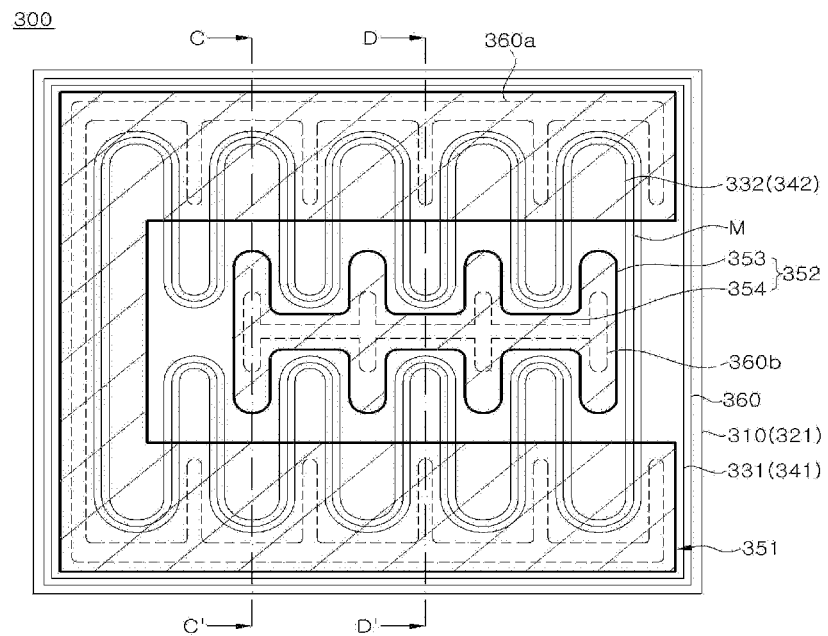
FIG. 14 is a plan view of a light emitting device according to another exemplary embodiment of the present invention.
Figure 15A:
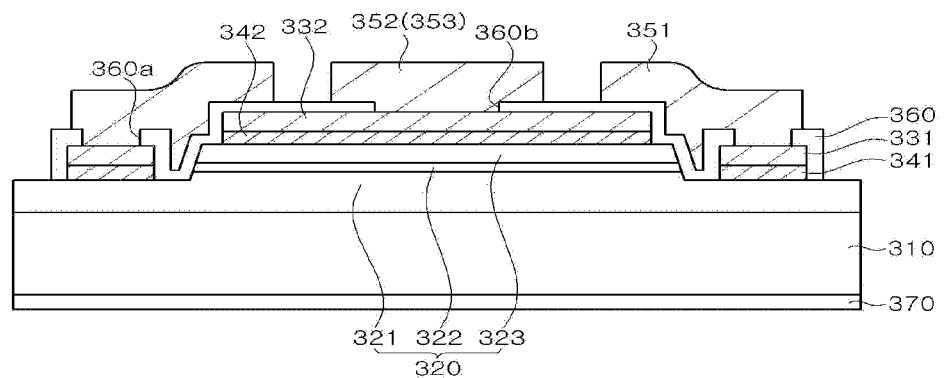
FIG. 15A and FIG. 15B are cross-sectional views taken along lines C-C' and D-D' of FIG. 14.
Figure 15B:
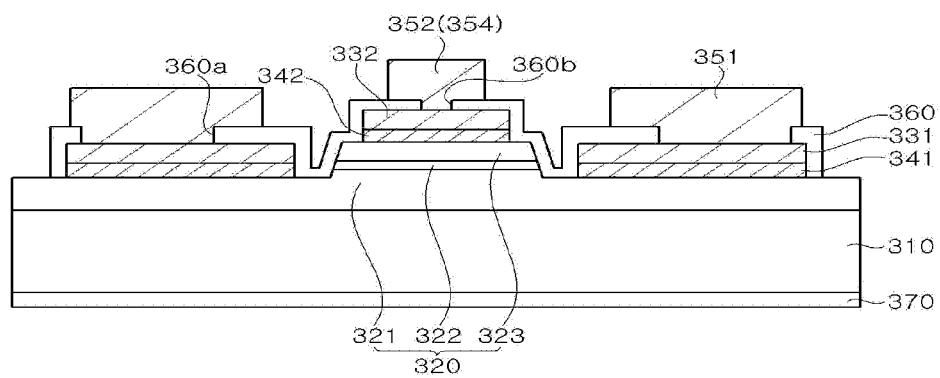

FIG. 14 is a plan view of a light emitting device 300 according to another exemplary embodiment of the present invention, and FIG. 15A and FIG. 15B are cross-sectional views taken along lines C-C' and D-D' of FIG. 14.

Referring to FIG. 14, FIG. 15A, and FIG. 15B, a light emitting device 300 includes a substrate 310, a semiconductor stack (e.g., light emitting diode) 320, which includes a first conductivity-type semiconductor layer 321, an active layer 322, and a second conductivity-type semiconductor layer 323, a first contact electrode 341, a second contact electrode 342, a first pad electrode 331, a second pad electrode 332, a passivation layer 360, a first bump electrode 351, a second bump electrode 352, and an anti-reflection layer 370.

The substrate 310, the first conductivity-type semiconductor layer 321, the active layer 322, and the second conductivity-type semiconductor layer 323 are similar to those described with reference to FIG. 1, FIG. 2, and FIG. 3, and thus detailed descriptions thereof will be omitted to avoid redundancy.

As described above, the semiconductor stack 320 includes the first conductivity-type semiconductor layer 321 and a mesa M disposed on the first conductivity-type semiconductor layer 321, in which the mesa M includes the active layer 322 and the second conductivity-type semiconductor layer 323. The mesa M may also include a portion of the first conductivity-type semiconductor layer 321.

On the other hand, the mesa M is disposed in some region on the first conductivity-type semiconductor layer 321. Generally, the mesa M is formed by sequentially growing the first conductivity-type semiconductor layer 321, the active layer 322, and the second conductivity-type semiconductor layer 323, followed by patterning the second conductivity-type semiconductor layer 323 and the active layer 322 through mesa etching.

As described with reference to FIG. 1, the mesa M has indentations. That is, the mesa M may have a structure including a main branch and sub-branches, in which the indentations are formed between the sub-branches. Such a structure can be described as a structure wherein unit mesas are connected to each other by a connection mesa. Here, a central portion extending to the connection mesa corresponds to the main branch, and the unit mesas extending from opposite sides of the main branch correspond to the sub-branches.

The widths of the sub-branches may be two times less than the width of the first conductivity-type semiconductor layer 321 exposed between the sub-branches. With the structure wherein the sub-branches are formed to have a relatively small width and are disposed over a broad region on the substrate 310, the side surface of the mesa M has an increased surface area. The main branch may have a broader width than the sub-branches, without being limited thereto. Alternatively, the width of the main branch may be less than or equal to the width of the sub-branches.

Since the mesa M includes the sub-branches having a relatively narrow width, the light emitting device package can reduce current paths through the first conductivity-type semiconductor layer 321 having a relatively large width, thereby reducing current crowding.

Referring again to FIG. 14, FIG. 15A, and FIG. 15B, the first contact electrode 341 is disposed on the first conductivity-type semiconductor layer 321 exposed around the mesa M. The first contact electrode 341 may be formed by depositing a plurality of metal layers, followed by alloying the metal layers through rapid thermal alloying (RTA). The first contact electrode 341 may include a reflective material. For example, the first contact electrode 341 may be formed by sequentially depositing Cr/Ti/Al/Ti/Au, followed by alloying through the RTA process at a temperature of, for example, 935° C., for several to dozens of seconds. Accordingly, the first contact electrode 341 becomes an alloy layer containing Cr, Ti, Al, and Au.

The first contact electrode 341 surrounds the mesa M along the circumference of the mesa M. In addition, the first contact electrode 341 is disposed in regions between the sub-branches, that is, in the indentations of the mesa M. The first contact electrode 341 is separated from the mesa M by a predetermined distance and may be formed in most of the upper region of the first conductivity-type semiconductor layer 321. The first contact electrode 341 is formed along the side surface of the mesa M. This structure provides a region between the mesa M and the first contact electrode 341, in which the first contact electrode 341 is absent. Thus, light emitted through the side surface of the mesa M can reenter the first conductivity-type semiconductor layer 321 through this region, and can be emitted outside through the substrate 310. A separation distance between the first contact electrode 341 and the mesa M may be constant along the circumference of the mesa M, without being limited thereto.

After formation of the first contact electrode 341, the second contact electrode 342 is formed on the mesa M. The second contact electrode 342 may be formed by depositing, for example, Ni/Au, followed by RTA at about 590° C. for 80 seconds. The second contact electrode 342 forms ohmic contact with the second conductivity-type semiconductor layer 323 and covers most of the upper region of the mesa M, for example, 80% or more of the upper region thereof.

The first pad electrode 331 and the second pad electrode 332 are formed on the first contact electrode 341 and the second contact electrode 342, respectively. The first pad electrode 331 and the second pad electrode 332 may be formed of the same metal by the same process. For example, the first and second pad electrodes 331, 332 may be composed of a Ti layer (300 Å)/Au layer (7,000 Å)/Ti layer (50 Å).

However, the inventive concepts are not limited thereto. As described above, for example, a step pad layer 133 may be interposed between the first pad electrode 331 and the first contact electrode 341.

Referring back to FIG. 14, FIG. 15A, and FIG. 15B, the first pad electrode 331 and the second pad electrode 332 are illustrated as having the same areas as the first contact electrode 341 and the second contact electrode 342 and as being disposed thereon, respectively. However, the inventive concepts are not limited thereto. For example, the first pad electrode 331 and the second pad electrode 332 may have smaller areas than the first contact electrode 341 and the second contact electrode 342 to be disposed thereon, respectively, or may have larger areas than the first contact electrode 341 and the second contact electrode 342 to cover upper and side surfaces thereof. Since the first and second pad electrodes 331, 332 covers not only the upper surfaces of the contact electrodes 341, 342 but also the side surfaces thereof, the first and second pad electrodes 331, 332 can protect the first and second contact electrodes 341, 342 from solder during solder or AuSn bonding.

The passivation layer 360 covers the mesa M, the first pad electrode 331, and the second pad electrode 332. The passivation layer 360 has an opening 360a exposing the first pad electrode 331 and an opening 360b partially exposing the second pad electrode 332 on the mesa M. The opening 360a overlaps the first contact electrode 341 and the opening 360b overlaps the second contact electrode 342.

The openings 360a may be disposed along an edge of the substrate 310 and also disposed inside the indentations of the mesa M, as indicated by a dotted line of FIG. 14. The openings 360a disposed inside the indentations may communicate with each other through the opening 360a disposed along the edge of the substrate 310. Alternatively, the openings may be separated from each other.

The openings 360b may be disposed on the mesa M to communicate with each other as a single opening. Alternatively, a plurality of openings 360b may be disposed on the mesa M to be separated from each other.

The first bump electrode 351 covers the openings 360a and is connected to the first pad electrode 331 through the openings 360a. The first bump electrode 351 is electrically connected to the first conductivity-type semiconductor layer 321 through the first pad electrode 331 and the first contact electrode 341. The first bump electrodes 351 are symmetrically disposed at opposite sides of the second bump electrode 352 and are connected to each other, with the second bump electrode 352 interposed therebetween.

In the exemplary embodiment described with reference to FIG. 1, the first bump electrodes 151 are separated from the mesa M. On the contrary, in this exemplary embodiment, the first bump electrode 351 is partially disposed on the mesa M and the second pad electrode 33,2 and is insulated from the mesa M and the second pad electrode 332 by the passivation layer 360. Since the first bump electrode 351 may be formed to overlap the mesa M, the first bump electrode 351 may be formed in a relatively large area, and thus, directly contact the first pad electrode 331 inside the indentations of the mesa M.

The second bump electrode 352 covers the opening 360b and is connected to the second pad electrode 332 through the opening 360b. The second bump electrode 352 is electrically connected to the second conductivity-type semiconductor layer 323 through the second pad electrode 332 and the second contact electrode 342. The second bump electrode 352 may have a structure including unit electrodes 353 and a connecting portion 354, like the exemplary embodiment described with reference to FIG. 1.

Each of the first bump electrode 351 and the second bump electrode 352 may be formed of, for example, Ti/Au/Cr/Au.

An anti-reflection layer 370 may be disposed on a lower surface of the substrate 310. The anti-reflection layer 370 may be a transparent insulation layer, such as a $SiO_2$ layer, and have a thickness corresponding to, for example, integer times ¼ of a UV wavelength. Alternatively, the anti-reflection layer 370 may be composed of a band pass filter formed by repeatedly stacking layers having different indices of refraction.

In this exemplary embodiment, the first bump electrode 351 partially overlaps the mesa M and partially cover the side surface of the mesa M. Accordingly, the first bump electrode 351 can reflect light emitted through the side surface of the mesa M to reenter the mesa M, thereby reducing light loss.

FIG. 16 to FIG. 19 are views illustrating a method of manufacturing the light emitting device shown in FIG. 14. FIGS. 16A, 17A, 18A, and 19A are plan views and FIGS. 16B, 17B, 18B, and 19B are cross-sectional views thereof taken along line C-C' of the plan view, respectively.

Figure 16A:
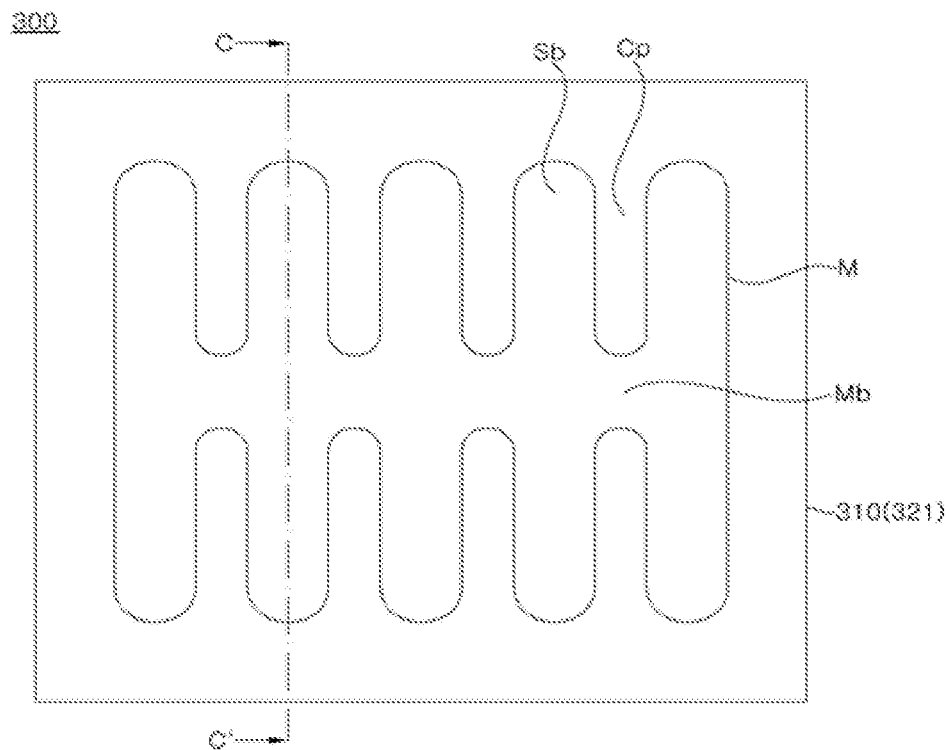
FIG. 16A, FIG. 16B, FIG. 17A, FIG. 17B, FIG. 18A, FIG. 18B, FIG. 19A, and FIG. 19B are plan views and cross-sectional views illustrating a method of manufacturing the light emitting device of FIG. 14.
Figure 16B:
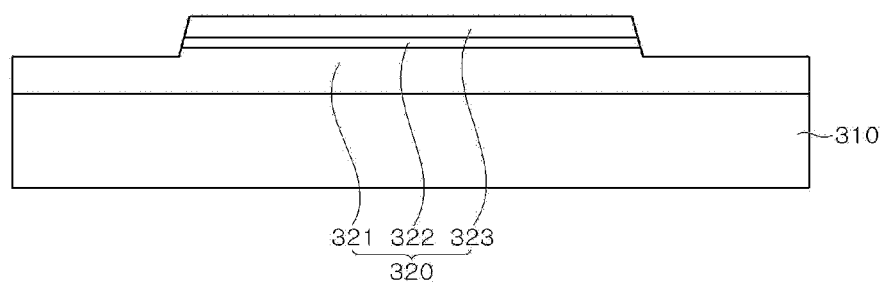

Referring to FIG. 16A and FIG. 16B, a first conductivity-type semiconductor layer 321, an active layer 322, and a second conductivity-type semiconductor layer 323 are formed on a substrate 310, followed by etching the second conductivity-type semiconductor layer 323 and the active layer 322 to form a mesa M, as described with reference to FIG. 4.

The mesa M is formed to have a shape including a main branch Mb and sub-branches Sb, and has indentations Cp between the sub-branches Sb. In the mesa M with the indentations, the sub-branches Sb can be formed to have a relatively narrow width.

Figure 17A:
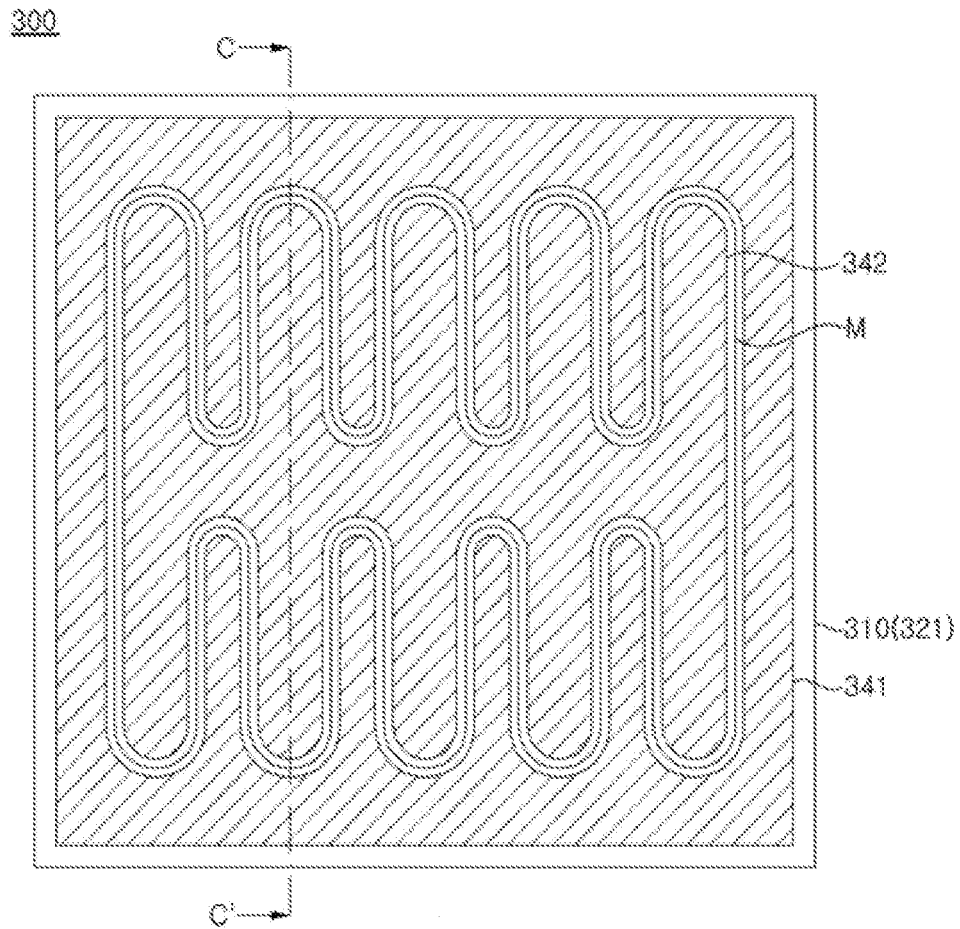
Figure 17B:
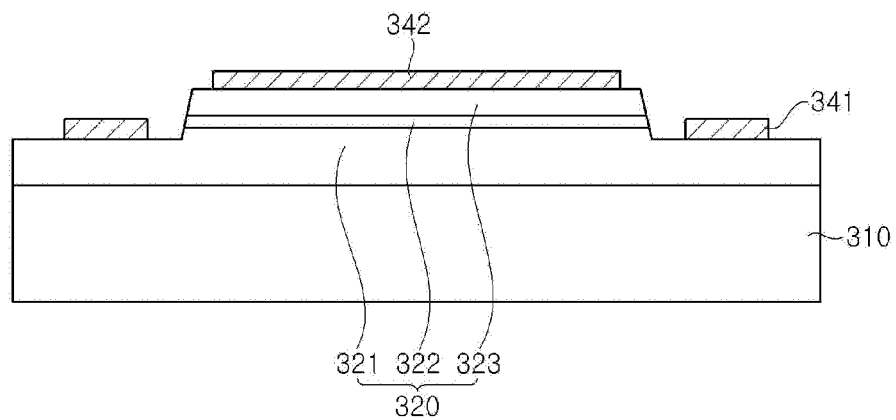

Referring to FIG. 17A and FIG. 17B, a first contact electrode 341 is formed on the first conductivity-type semiconductor layer 321 and a second contact electrode 342 is formed on the second conductivity-type semiconductor layer 323.

The first contact electrode 341 is disposed on the first conductivity-type semiconductor layer 321 exposed around the mesa M. The first contact electrode 341 may be formed by depositing a plurality of metal layers, followed by alloying the metal layers through rapid thermal alloying (RTA). In addition, the first contact electrode 341 may include a reflective material. For example, the first contact electrode 341 may be formed by sequentially depositing Cr/Ti/Al/Ti/Au, followed by alloying through the RTA process at a temperature of, for example, 935° C., for several to dozens of seconds. Accordingly, the first contact electrode 341 becomes an alloy layer containing Cr, Ti, Al, and Au.

After formation of the first contact electrode 341, the second contact electrode 342 is formed on the mesa M. The second contact electrode 342 may be formed by depositing, for example, Ni/Au, followed by RTA at about 590° C. for 80 seconds. The second contact electrode 342 forms ohmic contact with the second conductivity-type semiconductor layer 323 and covers most of the upper region of the mesa M, for example, 80% or more of the upper region thereof.

Figure 18A:
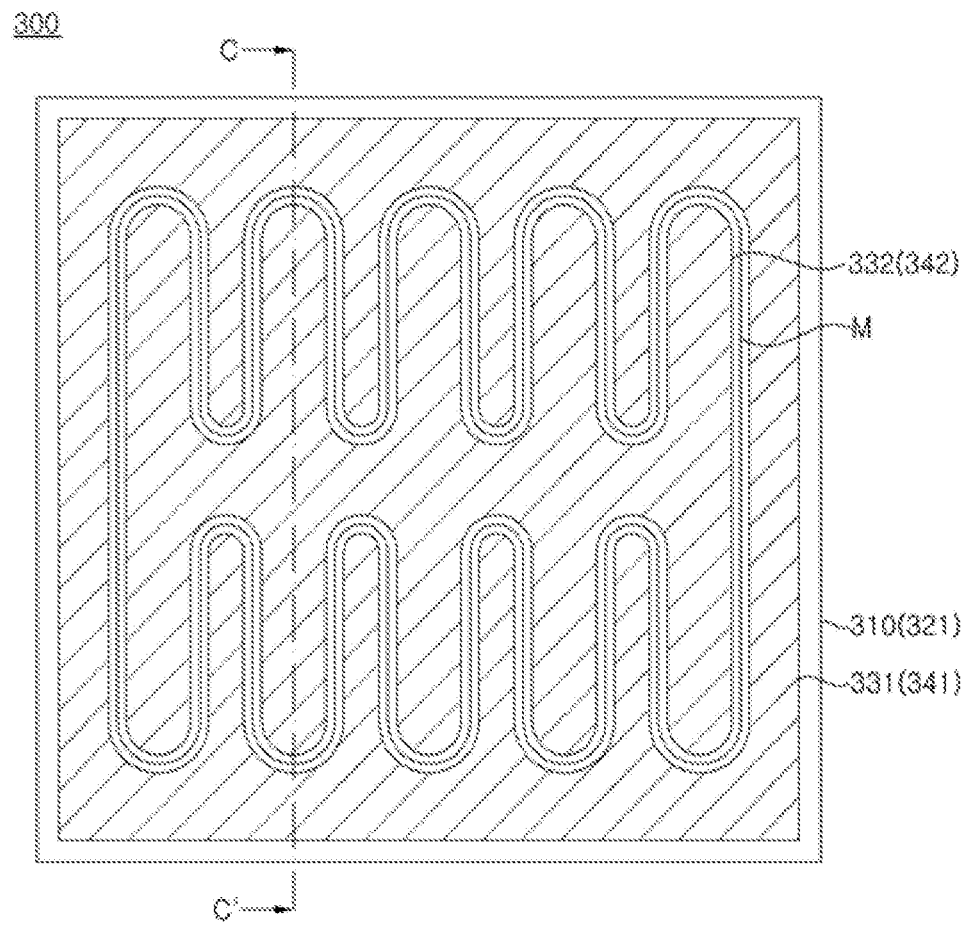
Figure 18B:
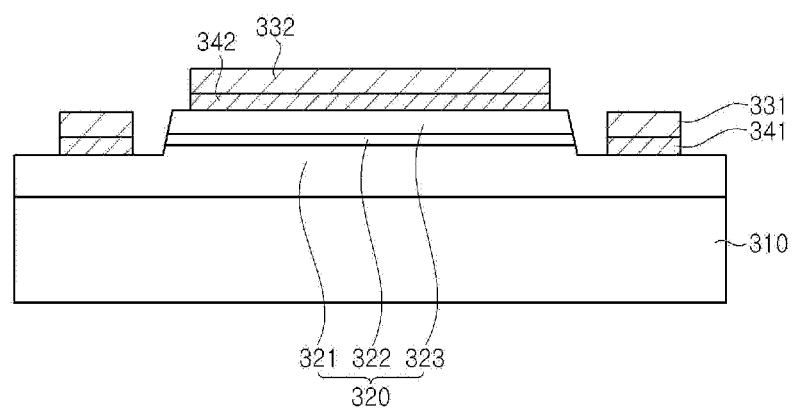

Referring to FIG. 18A and FIG. 18B, a first pad electrode 331 and a second pad electrode 332 are formed on the first contact electrode 341 and the second contact electrode 342, respectively. The first pad electrode 331 and the second pad electrode 332 may be formed of the same metal by the same process. For example, the first and second pad electrodes 331, 332 may be composed of a Ti layer (300 Å)/Au layer (7,000 Å)/Ti layer (50 Å).

Before formation of the first and second pad electrodes 331, 332, an anti-step layer (see FIG. 2 and FIG. 3) may be additionally formed on the first contact electrode 341.

Figure 19A:
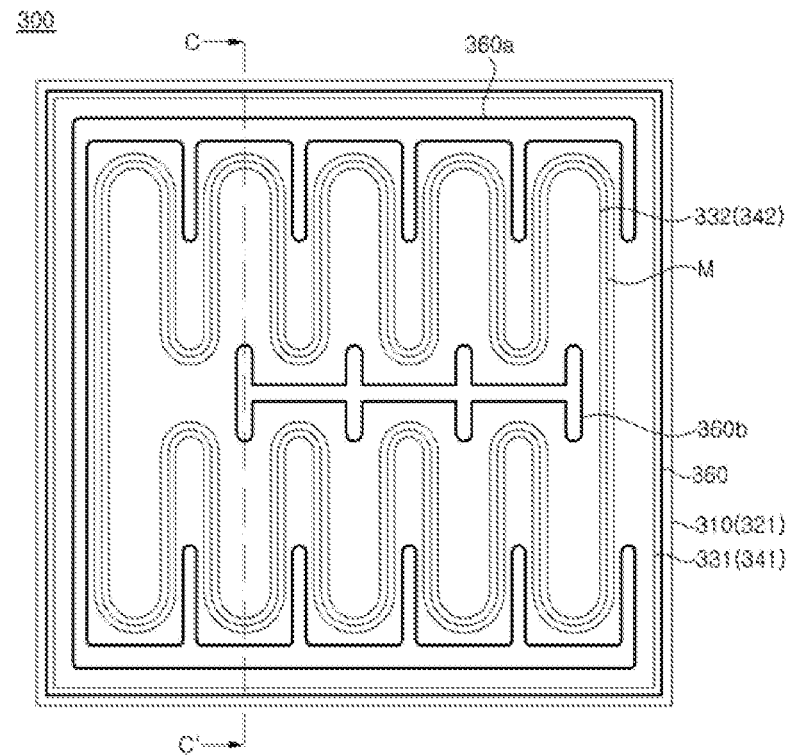
Figure 19B:
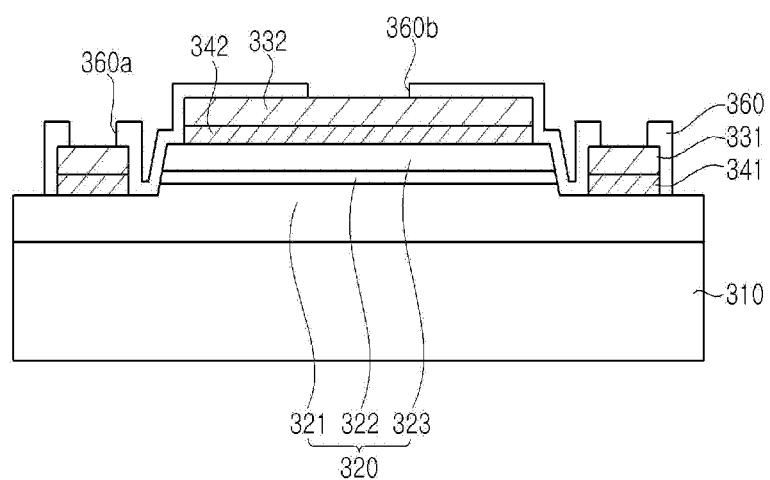

Referring to FIG. 19A and FIG. 19B, a passivation layer 360 having openings 360a, 360b formed to expose the surfaces of the first and second pad electrodes 331, 332 is formed. The opening 360a exposes the first pad electrode 331 around the mesa M and the opening 360b exposes the second pad electrode 332 on the mesa M.

The passivation layer 360 may be formed by forming an insulation layer over the entire upper surface of the substrate 310, followed by etching to expose the first and second pad electrodes 331, 332.

Then, a first bump electrode 351 and a second bump electrode 352 are formed on the first and second pad electrodes 331, 332, respectively, and an anti-reflection layer 370 is formed on the lower surface of the substrate 310, followed by dividing into individual light emitting devices, thereby completing the light emitting device 300, as shown in FIG. 14. The anti-reflection layer 370 may be omitted.

The first and second bump electrodes 351, 352 cover the openings 360a, 360b to contact the surfaces of the pad electrodes 331, 332, and may be formed to cover some regions on the surface of the passivation layer 160. In addition, as shown in FIG. 14, the first bump electrode 351 is partially placed in an upper region of the mesa M. With this structure, a portion of the first bump electrode 351 may be flush with the second bump electrode 352 in the upper region of the mesa M.

On the other hand, as in the exemplary embodiment described above, anti-step patterns may be formed in the openings 360a, 360b, or may be omitted.

FIG. 20 to FIG. 23 are plan views of light emitting devices 300a, 400, 500, and 600 according to exemplary embodiments of the present invention.

Figure 20:
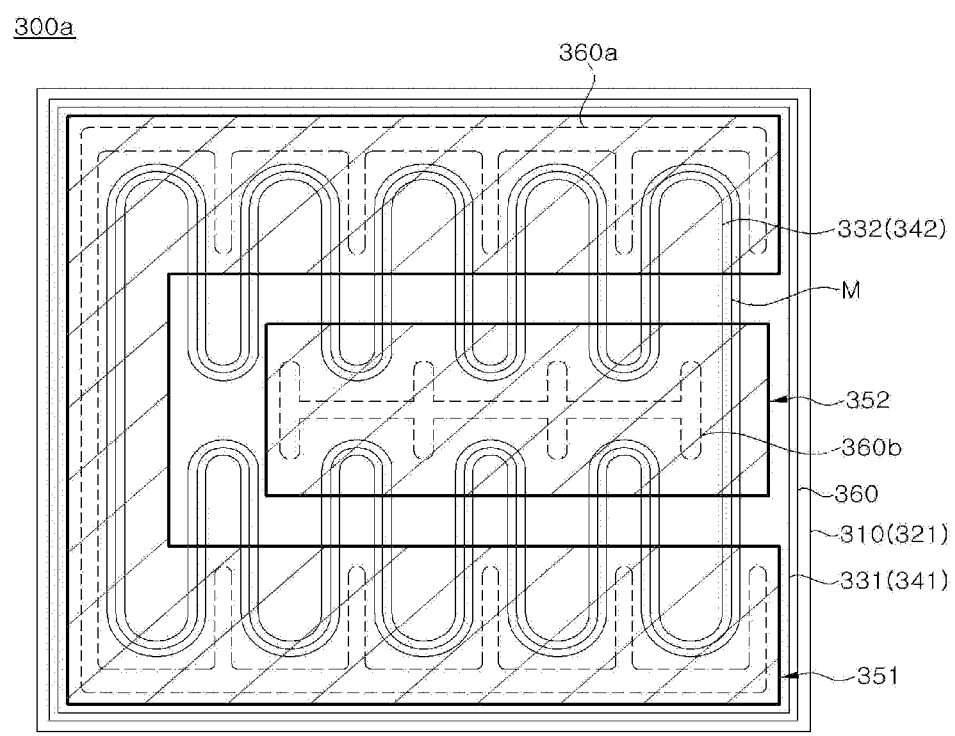
FIG. 20, FIG. 21, FIG. 22, and FIG. 23 are plan views of UV light emitting devices according to exemplary embodiments of the present invention.

Referring to FIG. 20, a light emitting device 300a according to an exemplary embodiment is generally similar to the light emitting device 300 described above except for the location and shape of the second bump electrode 352. Specifically, in the light emitting device 300 described above, the second bump electrode 352 is placed within the upper region of the mesa M, whereas the second bump electrode 352 according to the illustrated exemplary embodiment is formed in a substantially rectangular shape and partially covers upper regions of the indentations between the sub-branches. That is, the second bump electrode 352 overlaps the first contact electrode 341 and the first pad electrode 331, instead of being disposed within the upper region of the mesa M. In this exemplary embodiment, the second bump electrode 352 is insulated from the first pad electrode 331 and the first contact electrode 341 by the passivation layer 360.

According to this exemplary embodiment, since the second bump electrode 352 is placed outside the region of the mesa M, the size of the second bump electrode 352 can be further increased, thereby improving bonding strength upon bonding to a submount and the like.

Figure 21:
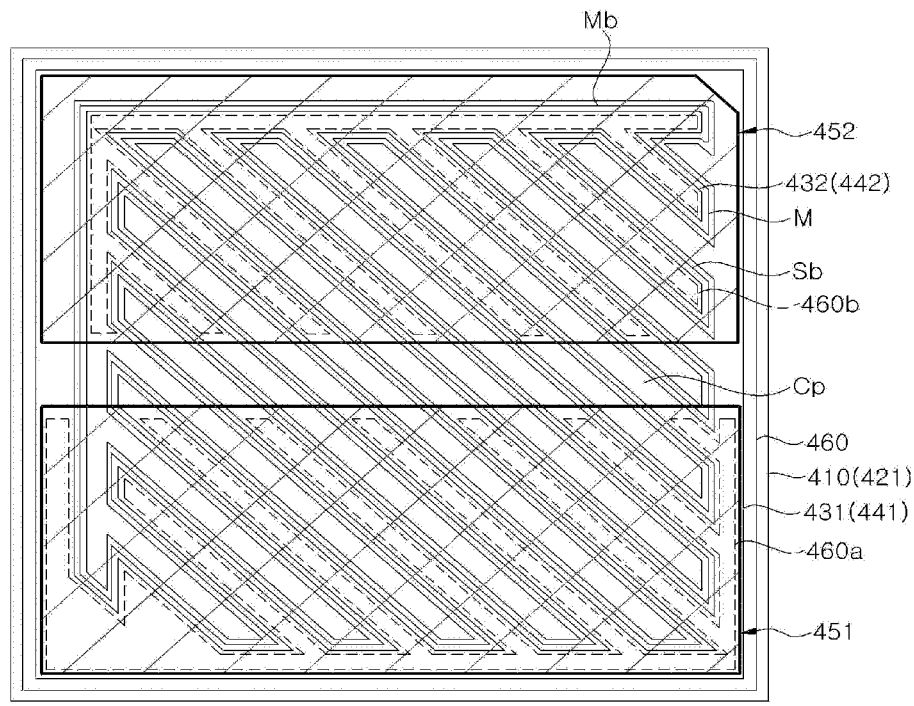

Referring to FIG. 21, a light emitting device 400 according to this exemplary embodiment includes a substrate 410, a light emitting stack (e.g., light emitting diode), which includes a first conductivity-type semiconductor layer 421, an active layer, and a second conductivity-type semiconductor layer, a first contact electrode 441, a second contact electrode 442, a first pad electrode 431, a second pad electrode 432, a passivation layer 460, a first bump electrode 451, and a second bump electrode 452. The light emitting device 400 may further include an anti-reflection layer.

The light emitting device 400 according to this exemplary embodiment is generally similar to the light emitting device 300 except for the shape of the mesa M and the locations and shapes of the first bump electrode 451 and the second bump electrode 452. Repeated description of the same components will be omitted in order to avoid redundancy.

A mesa M of the light emitting device 400 includes a main branch Mb and sub-branches Sb, and has indentations Cp placed between the sub-branches Sb. The main branch Mb is disposed along the edge of the substrate 410, and each of the sub-branches Sb extends at a predetermined angle from the main branch Mb. The main branch Mb may be continuously formed along two adjacent edges of the substrate 410 having a rectangular shape and the sub-branches Sb may extend from the main branch Mb to be parallel to each other.

Alternatively, the main branch Mb may be restrictively disposed near one edge of the substrate 410, and the sub-branches Sb may extend from the main branch Mb.

The sub-branches Sb may have different lengths and may be disposed parallel to a diagonal line of the substrate 410.

The first bump electrode 451 is electrically connected to the first pad electrode 431 through an opening 460a of the passivation layer 460, and the second bump electrode 452 is electrically connected to the second pad electrode 432 through an opening 460b of the passivation layer 460. The first bump electrode 451 covers the opening 460a to seal the opening 460a and partially covers the passivation layer 460. The second bump electrode 452 also covers the opening 460b to seal the opening 460a and partially covers the passivation layer 460.

The first bump electrode 451 and the second bump electrode 452 have rectangular shapes and are disposed to face each other. Accordingly, both of the first bump electrode 451 and the second bump electrode 452 partially overlap the mesa M and also partially overlap the indentations Cp of the mesa M.

Figure 22:
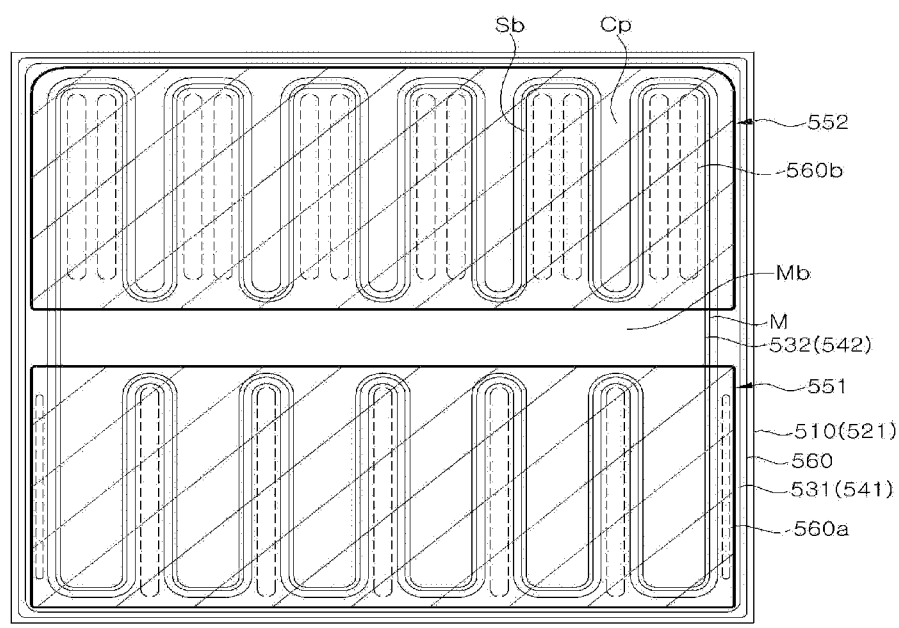

Referring to FIG. 22, a light emitting device 500 according to this exemplary embodiment includes a substrate 510, a light emitting stack (e.g., light emitting diode), which includes a first conductivity-type semiconductor layer 521, an active layer, and a second conductivity-type semiconductor layer, a first contact electrode 541, a second contact electrode 542, a first pad electrode 531, a second pad electrode 532, a passivation layer 560, a first bump electrode 551, and a second bump electrode 552. The light emitting device 500 may further include an anti-reflection layer.

The light emitting device 500 according to this exemplary embodiment is generally similar to the light emitting device 300 except for the shape of the mesa M, the locations and shapes of the first bump electrode 551 and the second bump electrode 552, and the locations and shapes of openings 560a, 560b of the passivation layer 560. Repeated description of the same components will be omitted in order to avoid redundancy.

The mesa M of the light emitting device 500 occupies a larger area of the substrate 510 than the mesa M of the light emitting device 300. For example, the width and length of the main branch Mb and the sub-branches Sb may be greater than the width and length of the main branch and the sub-branches of the light emitting device 300.

The openings 560a may be disposed outside the indentations of the mesa M and outside the mesa M to be separated from each other. In addition, the openings 560b may be disposed on the sub-branches Sb of the mesa M to be separated from each other. Two or more openings 560b may be disposed on each sub-branch Sb.

The first bump electrode 551 is electrically connected to the first pad electrode 531 through the openings 560a of the passivation layer 560, and the second bump electrode 552 is electrically connected to the second pad electrode 532 through the openings 560b of the passivation layer 560. The first bump electrode 551 covers the openings 560a to seal the openings 560a and partially covers the passivation layer 560. The second bump electrode 552 also covers the openings 560b to seal the openings 560a and partially covers the passivation layer 560.

The first bump electrode 551 and the second bump electrode 552 have rectangular shapes and are disposed to face each other. Accordingly, both of the first bump electrode 551 and the second bump electrode 552 partially overlap the mesa M and also partially overlap the indentations Cp of the mesa M.

Figure 23:
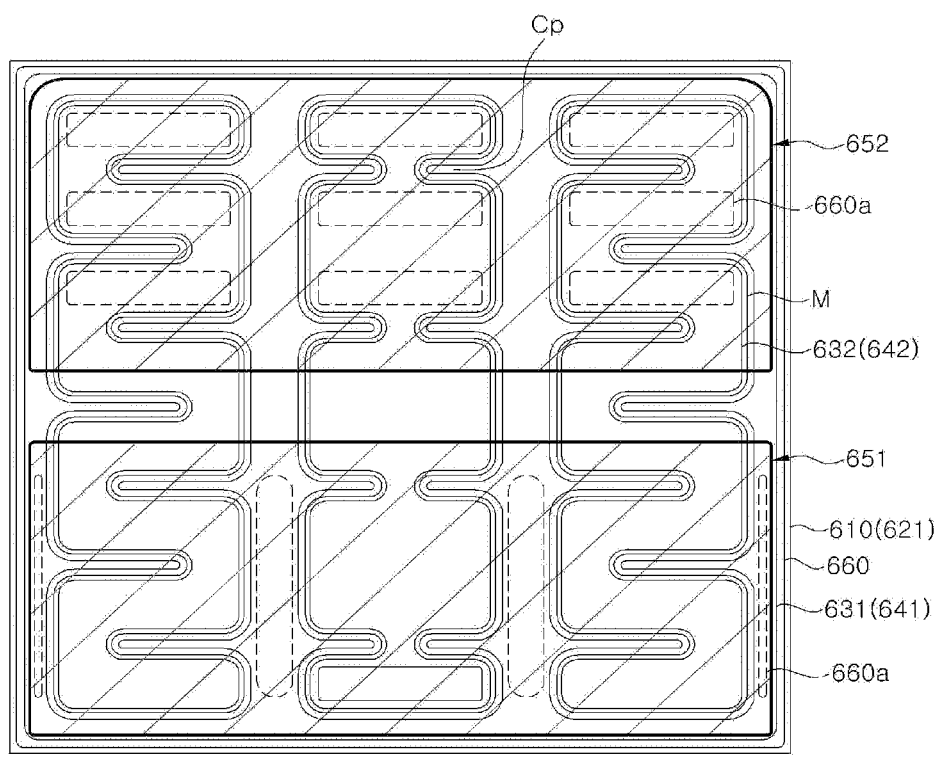

Referring to FIG. 23, a light emitting device 600 according to this exemplary embodiment includes a substrate 610, a light emitting stack (e.g., light emitting diode), which includes a first conductivity-type semiconductor layer 621, an active layer, and a second conductivity-type semiconductor layer, a first contact electrode 641, a second contact electrode 642, a first pad electrode 631, a second pad electrode 632, a passivation layer 660, a first bump electrode 651, and a second bump electrode 652. The light emitting device 600 may further include an anti-reflection layer.

The light emitting device 600 according to this exemplary embodiment is generally similar to the light emitting device 300 except for the shape of the mesa M, the locations and shapes of the first bump electrode 651 and the second bump electrode 652, and the locations and shapes of openings 660a, 660b of the passivation layer 660. Repeated description of the same components will be omitted in order to avoid redundancy.

The mesa M of the light emitting device 600 occupies a larger area of the substrate 610 than the mesa M of the light emitting device 300, and is divided into a plurality of regions. The mesa includes an indentation Cp placed in each of the divided regions.

The openings 660a may be disposed between the divided regions of the mesa M and outside the mesa M to be separated from each other. In addition, the openings 660b may be disposed in each of the divided regions on the mesa M to be separated from each other.

The first bump electrode 651 is electrically connected to the first pad electrode 631 through the openings 660a of the passivation layer 660, and the second bump electrode 652 is electrically connected to the second pad electrode 632 through the openings 660b of the passivation layer 660. The first bump electrode 651 covers the openings 660a to seal the openings 660a and partially covers the passivation layer 660. The second bump electrode 652 also covers the openings 660b to seal the openings 660a and partially covers the passivation layer 660.

The first bump electrode 651 and the second bump electrode 652 have rectangular shapes and are disposed to face each other. Accordingly, both of the first bump electrode 651 and the second bump electrode 652 partially overlap the mesa M and also partially overlap the indentations Cp of the mesa M.

Each of the light emitting devices 300a, 400, 500, and 600 described above can be fabricated into a light emitting device package as described with reference to FIG. 13.

Although some exemplary embodiments have been described herein, it should be understood that these embodiments are given by way of illustration only, and that various modifications, variations, and alterations can be made by those skilled in the art without departing from the spirit and scope of the present invention.

That is, it should be understood that these embodiments are provided for illustration only and are not to be construed in any way as limiting the present invention. For example, each of components described as a single component may be embodied as dispersed components, and components described as dispersed components may also be embodied as a coupled component.

In addition, a component described in a specific exemplary embodiment may also be applied to other exemplary embodiments without departing from the scope of the present invention.

Therefore, it should be understood that the scope of the present invention is limited only by the appended claims and all modifications, variations, and alterations deducible from the appended claims and equivalents thereto fall within the scope of the present invention.

The invention claimed is:

1. A UV light emitting device comprising:
   a substrate;
   a first conductivity-type semiconductor layer disposed on the substrate;
   a mesa disposed on the first conductivity-type semiconductor layer, and comprising a second conductivity-type semiconductor layer and an active layer interposed between the first conductivity-type semiconductor layer and the second conductivity-type semiconductor layer;
   a first contact electrode contacting the first conductivity-type semiconductor layer exposed around the mesa;
   a second contact electrode disposed on the mesa and contacting the second conductivity-type semiconductor layer;
   a passivation layer covering the first contact electrode, the mesa, and the second contact electrode, and comprising openings disposed on the first contact electrode and the second contact electrode; and
   a first bump electrode and a second bump electrode electrically connected to the first contact electrode and the second contact electrode through the openings of the passivation layer, respectively,
   wherein the mesa includes a main branch and a plurality of sub-branches extending from the main branch, such that the mesa has a plurality of indentations in plan view, and
   wherein each of the first bump electrode and the second bump electrode covers the openings of the passivation layer and a portion of the passivation layer.

2. The UV light emitting device of claim 1, wherein the first contact electrode contacts the first conductivity-type semiconductor layer at least in the indentations of the mesa.

3. The UV light emitting device of claim 1, further comprising:
   a first pad electrode disposed on the first contact electrode; and
   a second pad electrode disposed on the second contact electrode,
   wherein the openings of the passivation layer expose the first pad electrode and the second pad electrode, and the first bump electrode and the second bump electrode are connected to the first pad electrode and the second pad electrode through the openings, respectively.

4. The UV light emitting device of claim 3, wherein the first pad electrode and the second pad electrode comprise the same metallic material.

5. The UV light emitting device of claim 4, further comprising:
   a step pad layer interposed between the first contact electrode and the first pad electrode.

6. The UV light emitting device of claim 3, further comprising:
   an anti-step pattern disposed on the first pad electrode and the second pad electrode.

7. The UV light emitting device of claim 1, wherein:
   the openings of the passivation layer exposing the first contact electrode are separated from the mesa; and
   the openings of the passivation layer exposing the second contact electrode are disposed within an upper region of the mesa.

8. The UV light emitting device of claim 1, wherein the first contact electrode surrounds the mesa.

9. The UV light emitting device of claim 1, wherein the indentations have an elongated shape in the same direction.

10. The UV light emitting device of claim 1, wherein the substrate comprises at least one of a silicon (Si) substrate, a zinc oxide (ZnO) substrate, a gallium nitride (GaN) substrate, a silicon carbide (SiC) substrate, an aluminum nitride (AlN) substrate, and a sapphire substrate.

11. The UV light emitting device of claim 1, wherein the mesa has a mirror symmetry structure.

12. The UV light emitting device of claim 1, wherein a portion of the first bump electrode is disposed on the mesa to overlap the mesa, the first bump electrode being spaced apart from the mesa by the passivation layer.

13. The UV light emitting device of claim 1, wherein the openings of the passivation layer disposed on the first contact electrode are partially placed in the indentations.

14. The UV light emitting device of claim 1, further comprising a third bump electrode electrically connected to the first contact electrode and disposed to face the first bump electrode with the second bump electrode interposed therebetween.

15. The UV light emitting device of claim 14, wherein the first bump electrode and the third bump electrode are integrally connected.

16. The UV light emitting device of claim 1, wherein the second bump electrode has an arc-shaped end portion.

17. The UV light emitting device of claim 16, wherein the second bump electrode comprises a plurality of unit electrodes connected to each other by a connecting portion.

18. The UV light emitting device of claim 1, where in the UV emitting device is configured to emit deep UV light having a wavelength of 360 nm or less.

19. A UV light emitting device comprising:
   a substrate;
   a first conductivity-type semiconductor layer disposed on the substrate;
   a mesa disposed on the first conductivity-type semiconductor layer, and comprising a second conductivity-type semiconductor layer and an active layer interposed between the first conductivity-type semiconductor layer and the second conductivity-type semiconductor layer;
   a first contact electrode contacting the first conductivity-type semiconductor layer exposed around the mesa;
   a second contact electrode disposed on the mesa and contacting the second conductivity-type semiconductor layer;
   a passivation layer covering the first contact electrode, the mesa, and the second contact electrode, and comprising openings disposed on the first contact electrode and the second contact electrode; and
   a first bump electrode and a second bump electrode electrically connected to the first contact electrode and the second contact electrode through the openings of the passivation layer, respectively,
   wherein the mesa includes a main branch and a plurality of sub-branches extending from the main branch, such that the mesa has a plurality of indentations in plan view, and
   wherein some of the openings of the passivation layer are disposed outside the mesa and the indentations.

20. The UV light emitting device of claim 19, wherein the passivation layer further comprises openings disposed inside the indentations, and the openings disposed inside the indentations are connected to each other through the openings disposed outside the indentations.

21. The UV light emitting device of claim 19, wherein the passivation layer further comprises openings disposed inside the indentations, and the openings disposed inside the indentations are separated from each other.

* * * * *